(12) United States Patent
Shieh et al.

(10) Patent No.: US 9,337,083 B2
(45) Date of Patent: May 10, 2016

(54) MULTI-LAYER METAL CONTACTS (71) Applicant: Taiwan Semiconductor Manufacturing Company, Ltd., Hsin-Chu (TW)

(72) Inventors: Ming-Feng Shieh, Yongkang (TW); Wen-Hung Tseng, Luodong Township (TW); Chih-Ming Lai, Hsinchu (TW); Ken-Hsien Hsieh, Taipei (TW); Tsai-Sheng Gau, HsinChu (TW); Ru-Gun Liu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 38 days.

(21) Appl. No.: 13/911,183

(22) Filed: Jun. 6, 2013

(65) Prior Publication Data
US 2014/0252433 A1  Sep. 11, 2014

Related U.S. Application Data (60) Provisional application No. 61/775,642, filed on Mar. 10, 2013.

(51) Int. Cl.
*H01L 21/283* (2006.01)
*H01L 21/768* (2006.01)

(52) U.S. Cl.
CPC .... *H01L 21/76816* (2013.01); *H01L 21/76895* (2013.01); *H01L 21/76897* (2013.01)

(58) Field of Classification Search
CPC ................. H01L 21/76804; H01L 21/76816
USPC .................................. 257/288; 438/584–688
See application file for complete search history.

(56) References Cited

U.S. PATENT DOCUMENTS

| | | | |
|---|---|---|---|
| 2005/0085072 A1* | 4/2005 | Kim et al. | 438/684 |
| 2009/0014796 A1* | 1/2009 | Liaw | 257/347 |
| 2012/0032275 A1* | 2/2012 | Haran et al. | 257/401 |
| 2013/0049219 A1* | 2/2013 | Tsai et al. | 257/774 |

* cited by examiner

*Primary Examiner* — Mohsen Ahmadi
*Assistant Examiner* — Stephen Bradley
(74) *Attorney, Agent, or Firm* — Haynes and Boone, LLP (57) ABSTRACT

A method for forming metal contacts within a semiconductor device includes forming a first-layer contact into a first dielectric layer that surrounds at least one gate electrode, the first-layer contact extending to a doped region of an underlying substrate. The method further includes forming a second dielectric layer over the first dielectric layer and forming a second-layer contact extending through the second dielectric layer to the first-layer contact.

20 Claims, 5 Drawing Sheets

MULTI-LAYER METAL CONTACTS

This patent claims the benefit of U.S. Ser. No. 61/775,642 filed on Mar. 10, 2013, the disclosure of which is hereby incorporated by reference.

BACKGROUND

Semiconductor integrated circuits can include a variety of components, including transistors. Such circuits can also include metal lines and contacts that connect the components in the desired manner in order to form a functional, interconnected, and integrated circuit. Fabrication of such circuitry is often done layer upon layer on a semiconductor substrate, e.g., starting with a semiconductor wafer.

For example, a transistor can be formed on and in a semiconductor substrate to include a gate structure on the substrate and doped source and drain structures in the substrate. The structures are then covered and surrounded by an interlayer dielectric layer. Holes are formed through the interlayer dielectric layer extending down to the gate structure as well as the doped source and drain structures. These holes are then filled with a conductive material to form interconnects (also referred to as contacts or vias) for connection to one or more other circuit components, as needed.

Forming the holes to be filled with conductive material does not create a straight cylindrical shaped hole. Rather, the hole becomes narrower the deeper it extends. Because the gates and doped regions are at different heights, the holes for the doped region and the holes for the gates may have different sizes. Specifically, because the holes extending to the doped region are deeper, they may be wider on the top than the holes that extend to the gate electrodes.

The difference in hole size has an effect on pattern design. Particularly, the critical dimension, which relates to the amount of space allowed between holes, can be different for the holes that extend to the doped regions from the holes that extend to the gates. It is desirable to reduce this difference to allow for better overlay budget and critical dimension control.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIGS. 1A-1E are diagrams showing an illustrative process for forming metal contacts within a semiconductor device. FIGS. 1A-1E each illustrate three different views of the same device at a particular instance in the process. In each figure, the left column 102 illustrates a cross sectional view along a first (x) direction, the middle column 104 illustrates a top view, and the right column 106 illustrates a cross sectional view along a second (y) direction.

Figure 1A:
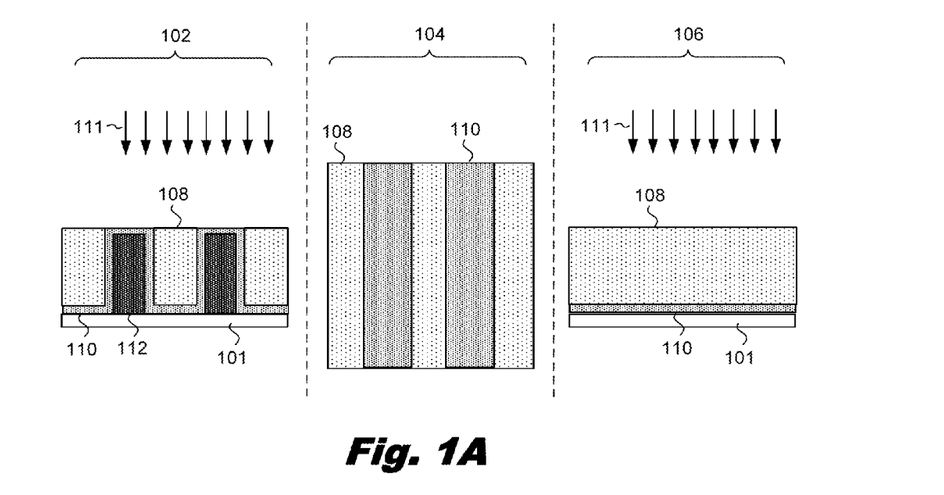
FIGS. 1A-1E are diagrams showing an illustrative process for forming metal contacts within a semiconductor device, according to one example of principles described herein.

FIG. 1A illustrates the formation of a first dielectric layer 108 around a number of gate electrodes 112. The gate electrodes 112 are formed on top of a substrate 101. Additionally, a hard mask layer 110 is formed over the gate electrodes 112. While the substrate 101 includes doped regions adjacent to the gate electrodes 112, such regions are not shown here to simplify the discussion.

According to certain illustrative examples, the substrate 101 may include, among other things, a silicon wafer. Alternatively or additionally, the substrate 101 may include another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In yet another alternative, the substrate 101 may also include a dielectric layer, a conducting layer, or combination thereof.

According to certain illustrative examples, the first dielectric layer 108 may be formed of a non-low-k dielectric material having a k value greater than 3.9, such as silicon oxide ($SiO_2$), silicon nitride (SiN), or silicon oxynitride (SiON). In an embodiment, the first dielectric layer 108 is formed of an oxide such as un-doped silicate glass (USG), boron-doped silicate glass (BSG), phosphorous-doped silicate glass (BSG), boron-doped phospho-silicate glass (BPSG), or the like. The first dielectric layer 108 may also be formed of a silicon oxide layer and a silicon nitride layer on the silicon oxide layer. The first dielectric layer 108 may alternatively be formed of a low-k dielectric material having a k value less than 3.9, such as fluorine-doped silicon oxide, carbon-doped silicon oxide, porous silicon oxide, porous carbon-doped silicon oxide, organic polymers, or silicone based polymers. In these embodiments, the first dielectric layer 108 may be formed using a chemical vapor deposition (CVD) or a physical vapor deposition (PVD) process.

According to certain illustrative examples, the gate electrodes 112 may be high k metal gates. While some gates are made of materials such as polysilicon, other gates may be made of metal. Such metal gates include a high-k dielectric material between the gate and the substrate. To form such gates, a dummy gate is formed onto the substrate. After a hard mask layer is formed around the dummy gates, the dummy gates can be removed and the high-k dielectric material and metal material can be filled within the space left by the removed dummy gate.

FIG. 1A also illustrates the first dielectric layer after a planarizing process 111 has been used such as a Chemical-Mechanical Polishing (CMP) process. The planarizing process 111 can remove excess dielectric material to expose the top of the hard mask material 110 formed over the gates 112.

According to the present example, the gate electrodes 112 are fin shaped. Specifically, they form an elongated shape. As can be seen from the top view 104, the exposed hard mask material 112 around the gate electrodes 112 runs in two parallel lines, one for each gate electrode 112. In the y-directional view 106, only the dielectric layer 108 is shown at this particular cross-section. In the x-directional view 102, the two gate electrodes 112 are shown with the surrounding hard mask material 110.

Figure 1B:
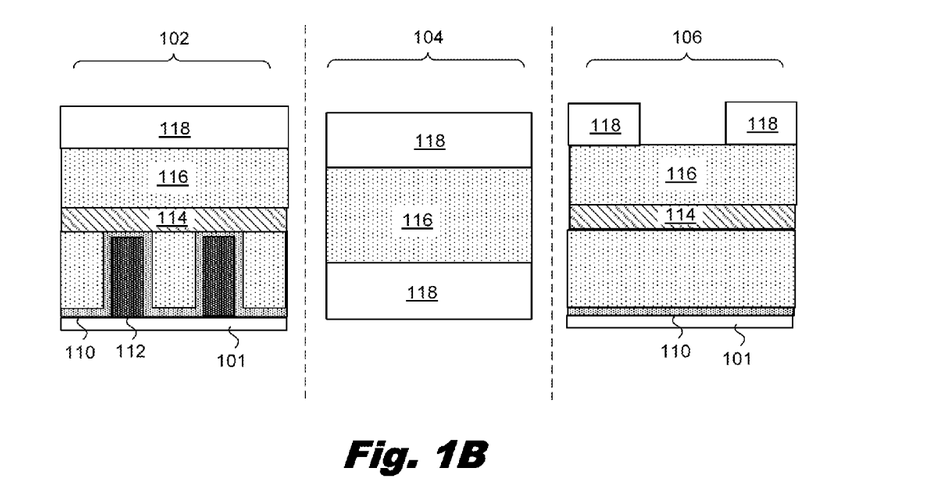

FIG. 1B illustrates the formation of an etching stop layer 114 on top of the first dielectric layer 108, the formation of a temporary dielectric layer 116 on top of the etching stop layer 114, and the formation of a photo-resist material 118 on top of the temporary dielectric layer 116. The etching stop layer 114 is used to aid in the etching process used to form metal contacts that connect to the gate electrodes 112 or doped regions within the substrate 101. According to certain illustrative examples, the etching stop layer 114 may include silicon nitride or silicon oxynitride.

According to certain illustrative examples, the photo-resist material 118 may be a positive-type material or a negative-type material. The photo-resist material 118 is used to pattern a first layer-contact into the first dielectric layer 108. The first dielectric layer 108 is patterned by a photolithography process. An exemplary photolithography process may include processing steps of photoresist coating 118, soft baking, mask aligning, exposing, post-exposure baking, developing photoresist and hard baking. The lithography process may implement krypton fluoride (KrF) excimer lasers, argon fluoride (ArF) excimer lasers, ArF immersion lithography, extreme ultra-violet (EUV) or electron-beam writing (e-beam). The photolithography exposing process may also be implemented or replaced by other proper methods such as maskless photolithography, ion-beam writing, and molecular imprint. When applying the developing solution to the exposed photoresist layer 118, the sacrificial layer underlying the exposed photoresist region (for positive photoresist) is partially or completely removed as well.

In the present example, the first-layer contact is to run perpendicular to the fin shaped gate electrodes 112.

Figure 1C:
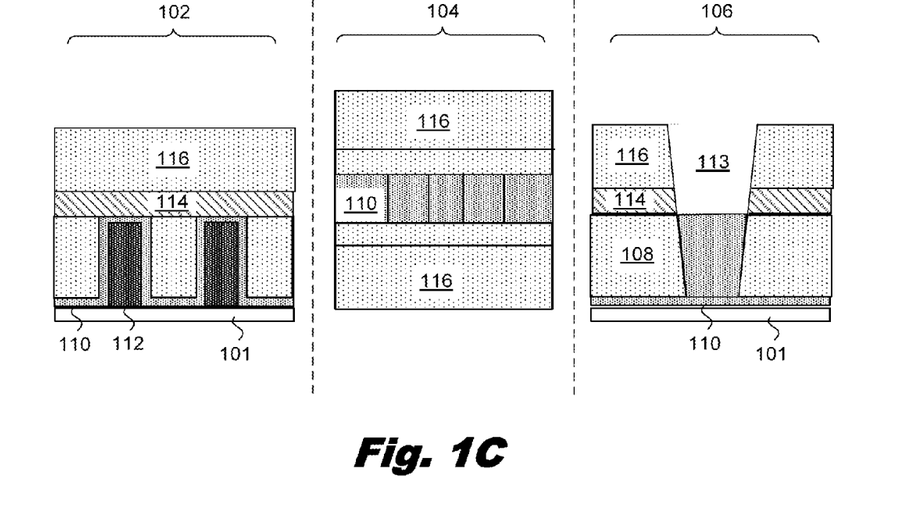

FIG. 1C illustrates the device after an etching process and removal of the photo-resist material 118. The etching process affects the regions exposed by the photo-resist material 118. Specifically, a hole 113 is etched down to the hard mask layer 110. Thus, the material that forms the hard mask layer 110 is selective with the material that forms the dielectric layers 108, 116 being etched away.

Because the hole 113 runs perpendicular to the gate electrodes 112, the hole 113 is not seen in the x-directional view 102. In the top view, however, the hole 113 can be seen as exposing the hard mask layer 110. Specifically, the etching process occurs down to the hard mask material 110 surrounding the gate electrodes 112 and the hard mask material 110 deposited along the substrate 101. The y-directional view 106 illustrates the hole 113 extending down to the gate electrode 112 and the hard mask layer 110 along the substrate 101. Due to standard etching processes, the hole 113 does not go straight down. Rather, the hole 113 becomes narrower as it extends deeper.

Figure 1D:
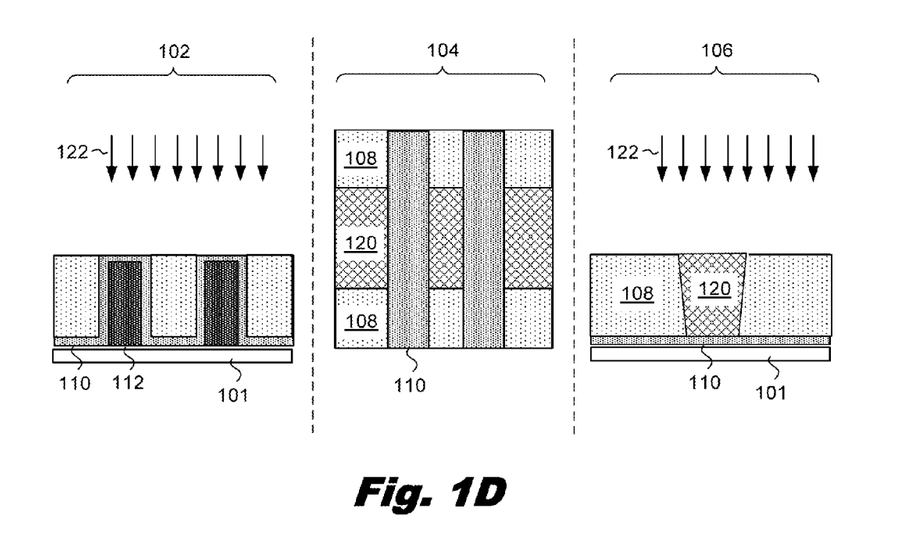

FIG. 1D illustrates a CMP process 122 after the hole has been filled with a metal material to form a metal contact 120. The metal contact can include various materials, including barrier layers and seed layers. For example, the metal contact 120 may include titanium nitride (TiN), tantalum nitride (TaN) or platinum (Pt). In addition, the metal contact may include various fill materials, such as tungsten, copper, aluminum or combinations thereof. The metal contact 120 can be formed by atomic layer deposition (ALD), physical vapor deposition (PVD or sputtering), or alternatively other suitable processes.

According to the present example, the CMP process 122 grinds down the device until the hard mask layer 110 on top of the gate electrodes 112 is exposed. This grinding removes the temporary dielectric layer 116, the etch stop layer 114, and any metal material above the gate electrodes 112. This leaves a first-layer metal contact 120 at desired regions within the semiconductor device.

The metal contact 120 cannot be seen from the x-directional view 102. From the top view 104, the metal contact can be seen between the gate electrodes 112. The metal contact 120 can also be seen from the y-directional view 106.

Figure 1E:
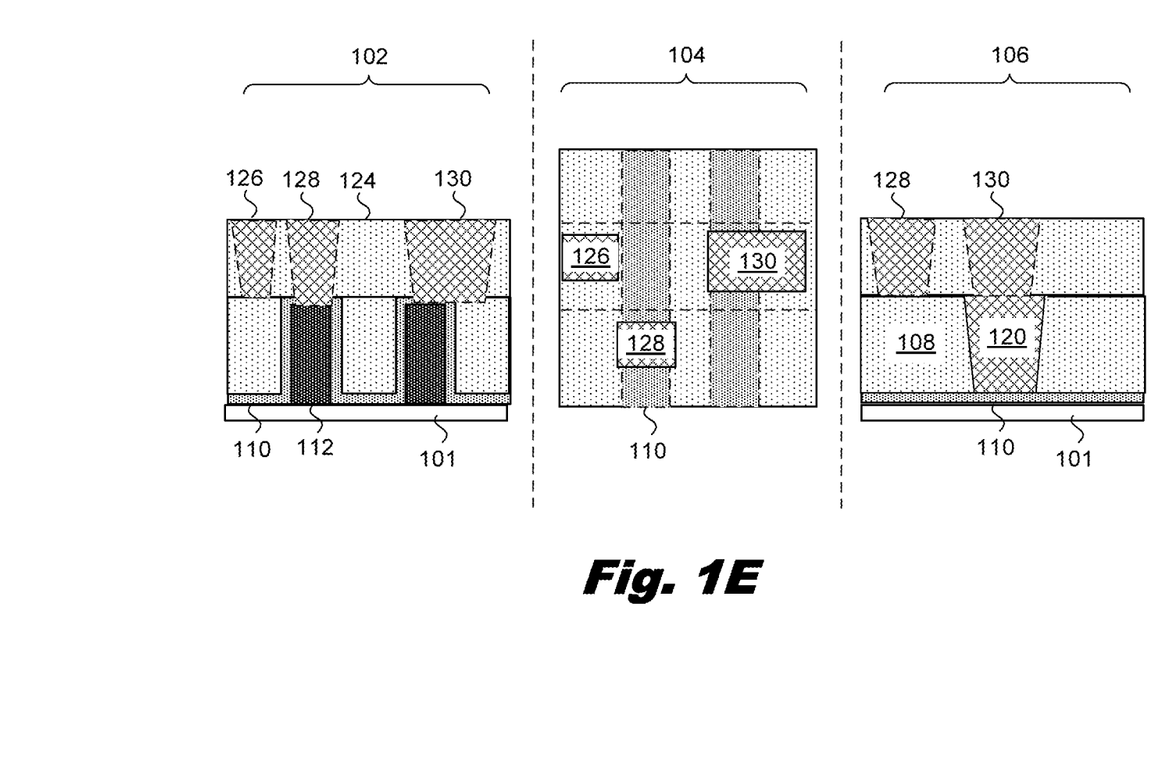

FIG. 1E illustrates the formation of second-layer contacts 126, 128, 130 formed into a second dielectric layer 124 that is formed over the first dielectric layer 108. The second-layer metal contact may include material similar to or different from those discussed above with reference to the first-metal layer contact. According to the present example, a second-layer metal contact 126 is formed over the first-metal layer contact only. Thus, the combination of the first-layer metal contact 120 and the second-layer metal contact form a full contact extending down to the doped region of the substrate. Such a metal contact 126 can be used to connect to a source or drain terminal of a transistor.

According to the present example, a second-layer metal contact 128 is formed through the second dielectric layer 124 down to a gate electrode 112. The contact extends through the hard mask layer 110 in order to contact the actual gate 112. This contact is positioned so that it does not make contact with any first-layer metal contact 120. This would cause a short in the circuit between the gate and the doped regions.

Additionally, a second-layer metal contact 130 is formed over both the gate electrode 112 and the first-layer metal contact 120. In some circuits, it is desirable to create a connection between a source or drain terminal of a transistor with the gate of the transistor. Such connections can be efficiently made with a second-layer metal contact 130 as illustrated here.

The x-directional view 102 illustrates each of the second-layer metal contacts 126, 128, 130. The contacts are shown as dotted lines because they are positioned deeper within the cross-section. The top view also illustrates each of the second-layer metal contacts 126, 128, 130. The y-directional view illustrates the second-layer metal contact 128 that extends to the gate electrode 112 only and the second-layer metal contact 130 that extends to both the gate electrode 112 and a first-layer metal contact 120.

Each of the second-layer metal contacts 126, 128, 130 may be formed through standard lithographic processes. For example, a photo-resist material may be used to pattern the second dielectric layer 124. After exposure to a light source through a photo-mask and development of the photo-resist layer, holes can be formed at regions where the photo-resist layer was removed. These holes can then be filled with a metal material to form the second-layer metal contacts 126, 128, 130.

Figure 2A:
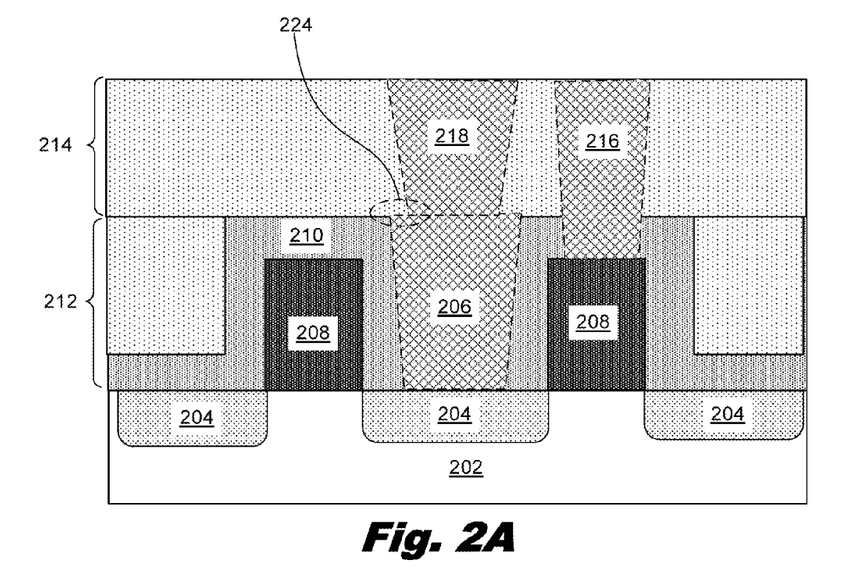
FIGS. 2A-2B are diagrams showing an illustrative semiconductor device with multi-layer contacts, according to one example of principles described herein.
Figure 2B:
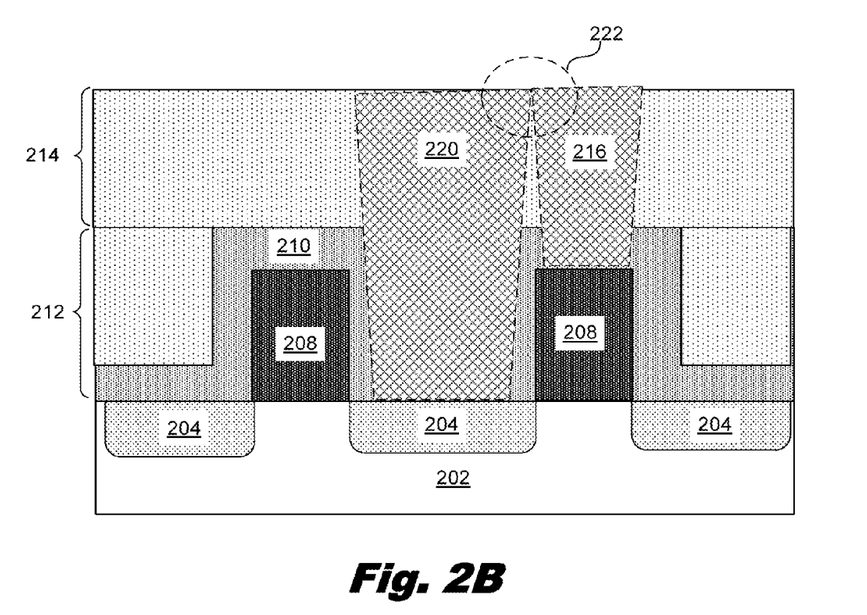

FIGS. 2A-2B are diagrams showing an illustrative semiconductor device with multi-layer contacts. FIG. 2A illustrates a multi-layer metal contact embodying principles described herein. In contrast, FIG. 2B illustrates a traditional method of forming metal contacts of varying heights that are formed in the same process.

FIG. 2A illustrates doped regions 204 formed into a substrate 202. The doped regions 204 are adjacent to the gate electrodes 208 so as to form complete transistors. Similar to the structure shown in FIGS. 1A-1E, the gates 208 are surrounded by a hard mask material 210. Additionally a first dielectric layer 212 surrounds the gate electrodes. A first-layer metal contact 206 is formed within the first dielectric layer 212. The first-layer metal contact extends down to a doped region 204.

A second dielectric layer 214 is formed on top of the first dielectric layer 212. The second-layer metal contacts 216, 218 are formed within the second dielectric layer 214. One second-layer contact 216 extends down to a gate electrode 208. The other second-layer contact 218 extends down to the first-layer metal contact 206.

In the present example, both of the second-layer metal contacts 216, 218 are formed in the same patterning process. Additionally, because the second-layer metal contact 218 that connects to the doped region 204 does not have to extend all the way down to the doped region 204, it can be made with a smaller size hold at the top. This allows for better overlay control. Particularly, the patterning of a device embodying principles herein can form components closer together because the hole extending down to the doped regions 204 does not have to be as large at the top.

Because the full contact that extends down to the doped regions 204 is formed in two separate processes, a step 224 is formed between the first-layer contact 206 and the second-layer contact 218. This step, however, has no substantial effect on the electrical connection between the first-layer contact 206 and the second-layer contact 218.

FIG. 2B illustrates traditional methods where the contact that connects to the doped region is formed in the same process as the contact that connects to the gate electrode 208. Because there is no first-layer metal contact over the doped region, the single-process second-layer contact 220 has a wider hole on top because the hole becomes narrower as it extends deeper. Because the contact 220 extends deeper than the contact 216 that connects to the gate electrode 208, the hole on top has to be wider. This can lead to a short circuit 222 if the contacts 216, 220 are placed close enough to each other that an electrical connection can be made.

In other words, the critical dimension at the top of the contact 220 is substantially different from the critical dimension at the bottom of the contact 220 due to the depth of the contact 220. In FIG. 2A, however, the critical dimension at the top of the metal contact 218 is substantially similar to the critical dimension at the top of the first-layer metal contact.

Figure 3:
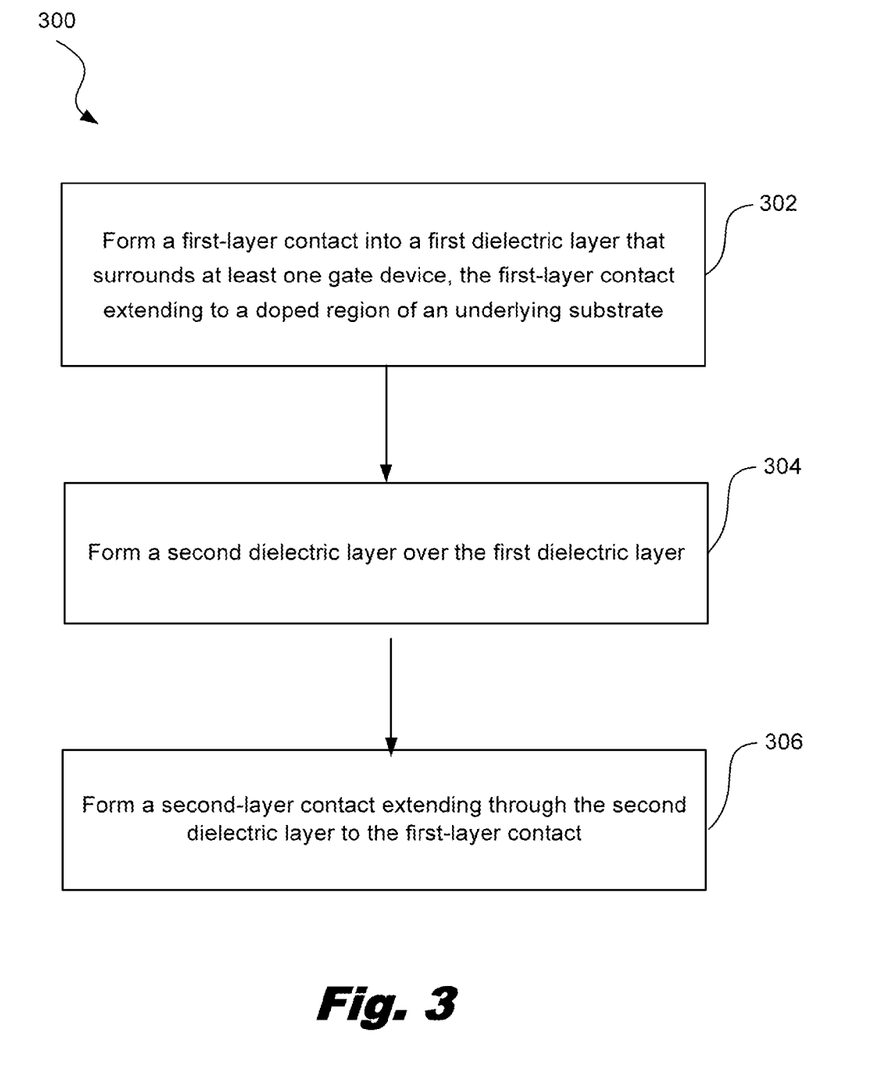
FIG. 3 is a flowchart showing an illustrative method for forming multi-layer metal contacts within a semiconductor device, according to one example of principles described herein.

FIG. 3 is a flowchart showing an illustrative method for forming multi-layer metal contacts within a semiconductor device. According to the present example, the method includes a step of forming 302 a first-layer contact into a first dielectric layer that surrounds at least one gate electrode, the first-layer contact extending to a doped region of an underlying substrate. The method further includes a step of forming 304 a second dielectric layer over the first dielectric layer. The method further includes a step of forming 306 a second-layer contact extending through the second dielectric layer to the first-layer contact.

According to certain illustrative, a method for forming metal contacts within a semiconductor device includes forming a first-layer contact into a first dielectric layer that surrounds at least one gate electrode, the first-layer contact extending to a doped region of an underlying substrate, forming a second dielectric layer over the first dielectric layer, and forming a second-layer contact extending through the second dielectric layer to the first-layer contact.

According to certain illustrative examples, a semiconductor device includes a substrate that includes a doped region, a first dielectric layer surrounding at least one gate electrode formed on the substrate, the first dielectric layer including a first-layer contact extending to the doped region, and a second dielectric layer formed over the first dielectric layer, the second dielectric layer including a second-layer contact extending through the second dielectric layer to the first-layer contact.

A method for forming metal contacts within a semiconductor device includes forming a gate electrode on a substrate, forming a doped region in the substrate adjacent to the gate electrode, forming a first dielectric layer over the gate electrode, forming a first-layer contact into the first dielectric layer, forming a second dielectric layer over the first dielectric layer, and forming a second-layer contact extending through the second dielectric layer to the first-layer contact such that there is a step between the first-layer contact and the second-layer contact.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method for forming metal contacts within a semiconductor device, the method comprising:
   forming a hard mask layer directly on opposing sidewalls and a top surface of a gate electrode over a semiconductor substrate, wherein the top surface extends between the opposing sidewalls and the hard mask layer physically contacts the opposing sidewalls and the top surface of the gate electrode;

forming a first dielectric layer over the semiconductor substrate such that the first dielectric layer surrounds the gate electrode;

forming a temporary dielectric layer over the hard mask layer and the first dielectric layer;

forming a trench that extends through the temporary dielectric layer, first dielectric layer, and the hard mask layer, wherein the hard mask layer defines a sidewall of the trench while physically contacting the opposing sidewalls of the gate electrode;

forming a first-layer contact in the trench, the first-layer contact extending to a doped source/drain region in the semiconductor substrate;

after forming the first-layer contact in the trench, removing the temporary dielectric layer to expose a portion of the hard mask layer, the portion of the hard mask layer covering a top surface of the gate electrode, the top surface of the gate electrode facing away from the semiconductor substrate;

forming a second dielectric layer over the first dielectric layer and the portion of the hard mask layer covering the top surface of the gate electrode; and forming a second-layer contact extending through the second dielectric layer to the first-layer contact.

2. The method of claim 1, further comprising, forming another second layer contact extending through the second dielectric layer to the gate electrode.

3. The method of claim 1, further comprising, forming a contact that extends through the second dielectric layer to both the gate electrode and the first-layer metal contact.

4. The method of claim 1, wherein forming the second-layer contact forms a step between the first-layer contact and the second-layer contact.

5. The method of claim 1, wherein a critical dimension of the first-layer contact is substantially similar to a critical dimension of the second-layer contact.

6. The method of claim 1, wherein the gate electrode includes a high-k metal gate electrode.

7. The method of claim 1, further comprising, forming a second layer contact extending through the second dielectric layer and the hard mask layer to connect with the gate electrode.

8. The method of claim 1, further comprising forming a contact etch stop layer over the hard mask layer, and
wherein removing the temporary dielectric layer to expose the portion of the hard mask layer includes removing the contact etch stop layer.

9. The method of claim 8, wherein forming the trench includes the trench extending through the contact etch stop layer.

10. A method for forming metal contacts within a semiconductor device, the method comprising:
forming a gate electrode on a substrate, the gate electrode having opposing sidewalls and a top surface extending between the opposing sidewalls;
doping a region in the substrate adjacent to the gate electrode to form a doped region;
forming a hard mask layer directly on the opposing sidewalls and the top surface of the gate electrode such that the hard mask layer physically contacts and covers the top surface of the gate electrode and physically contacts and covers the opposing sidewalls of the gate electrode, the top surface of the gate electrode facing away from the substrate;

forming a first dielectric layer over the substrate such that the first dielectric layer surrounds the gate electrode;

forming a temporary dielectric layer over the hard mask layer and the first dielectric layer;

forming a trench that extends through the temporary dielectric layer, first dielectric layer, and the hard mask layer such that the hard mask layer defines a sidewall of the trench while physically contacting the opposing sidewalls of the gate electrode;

forming a first-layer contact in the trench;

after forming the first-layer contact in the trench, removing the temporary dielectric layer to expose a top surface of the first dielectric layer and expose a portion of the hard mask layer covering the top surface of the gate electrode;

forming a second dielectric layer over the first dielectric layer and the portion of the hard mask layer covering the top surface of the gate electrode; and forming a second-layer contact extending through the second dielectric layer to the first-layer contact such that there is a step between the first-layer contact and the second-layer contact.

11. The method of claim 10, further comprising, forming another second layer contact extending through the second dielectric layer to the gate electrode within the first dielectric layer.

12. The method of claim 10, wherein a critical dimension of the first-layer contact is substantially similar to a critical dimension of the second-layer contact.

13. The method of claim 10, wherein the gate electrode includes a high-k metal gate electrode.

14. A method comprising:
forming a source/drain feature in a semiconductor substrate;
forming a gate electrode over the semiconductor substrate, the gate electrode having opposing sidewalls and a top surface extending between the opposing sidewalls;
forming a hard mask layer directly on the opposing sidewalls and the top surface of the gate electrode such that the hard mask layer physically contacts the opposing sidewalls and the top surface of the gate electrode;
forming an etch stop layer over the hard mask layer;
forming a first dielectric layer over the semiconductor substrate such that the first dielectric layer surrounds the gate electrode;
forming a second dielectric layer over the etch stop layer;
forming a trench that extends through the second dielectric layer, the etch stop layer, the hard mask layer, and the first dielectric layer such that the hard mask layer defines a sidewall of the trench while physically contacting the opposing sidewalls of the gate electrode;
forming a first conductive feature in the trench, the first conductive feature extending to the source/drain feature in the semiconductor substrate;
after forming the first conductive feature in the trench, removing the second dielectric layer and the etch stop layer to expose a portion of the hard mask layer covering a top surface of the gate electrode, the top surface of the gate electrode facing away from the semiconductor substrate;
forming a third dielectric layer over the first dielectric layer and the portion of the hard mask layer covering the top surface of the gate electrode; and
forming a second conductive feature extending through the third dielectric layer to the first conductive feature.

15. The method of claim 14, wherein removing the second dielectric layer and the etch stop layer to expose the portion of the hard mask layer covering the top surface of the gate electrode includes performing a planarization process to remove the second dielectric layer and the etch stop layer.

16. The method of claim 15, wherein after performing the planarization process a top surface of the first dielectric layer is substantially coplanar with a top surface of the hard mask layer.

17. The method of claim 14, wherein removing the second dielectric layer and the etch stop layer to expose the portion of the hard mask layer covering the top surface of the gate electrode includes completely removing the second dielectric layer.

18. The method of claim 14, wherein the first conductive feature has a first width and the second conductive feature has a second width that is less than the first width.

19. The method of claim 14, further comprising forming a third conductive feature extending through the third dielectric layer to the gate electrode.

20. The method of claim 14, wherein forming the hard mask layer directly on the opposing sidewalls and the top surface of the gate electrode such that the hard mask layer physically contacts the opposing sidewalls and the top surface of the gate electrode includes forming the hard mask layer directly on the source/drain feature such that the hard mask layer physically contracts the source/drain feature, and
    wherein after forming the first conductive feature in the trench, the hard mask layer physically contacting one of the opposing sidewalls extends continuously from the one of the opposing sidewalls of the gate electrode along the source/drain feature to the first conductive feature.

\* \* \* \* \*